(12) United States Patent
Terashima et al.

(10) Patent No.: US 6,351,512 B1
(45) Date of Patent: Feb. 26, 2002

(54) X-RAY EXPOSURE APPARATUS

(75) Inventors: Shigeru Terashima, Utsunomiya; Yutaka Watanabe, Tochigi-ken, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/489,914

(22) Filed: Jan. 24, 2000

(30) Foreign Application Priority Data

Jan. 27, 1999 (JP) .......................................... 11-018496

(51) Int. Cl.$^7$ ............................ G01N 23/00; G21K 5/00
(52) U.S. Cl. ............................................ 378/1; 378/34
(58) Field of Search ...................................... 378/1, 34

(56) References Cited

U.S. PATENT DOCUMENTS 5,524,131 A * 6/1996 Uzawa et al. .................. 378/34
5,623,529 A * 4/1997 Ebinuma et al. ............... 378/34

FOREIGN PATENT DOCUMENTS

| JP | 61-65434 | 4/1986 |
| JP | 61065434 | * 4/1986 |
| JP | 4-100049 | 4/1992 |

* cited by examiner

Primary Examiner—Frank G. Font
Assistant Examiner—Armando Rodriguez
(74) Attorney, Agent, or Firm—Fitzpatrick, Cella, Harper & Scinto

(57) ABSTRACT

An X-ray exposure apparatus includes a partition structure for defining therein an ambience of one of an atmospheric pressure and a reduced pressure, for accommodating an X-ray mask and an article to be exposed, an X-ray window provided on the partition structure for spatially isolating the inside of the partition structure and an X-ray source, and having a function for transmitting therethrough an X-ray beam with which the article as placed inside the partition structure can be exposed through the X-ray mask, and a scanning mechanism for scanningly moving the X-ray window in a direction intersecting with an optical axis of the X-ray beam, in a single exposure and without interruption at least from just before the start of the exposure to just after the end of the exposure.

19 Claims, 11 Drawing Sheets

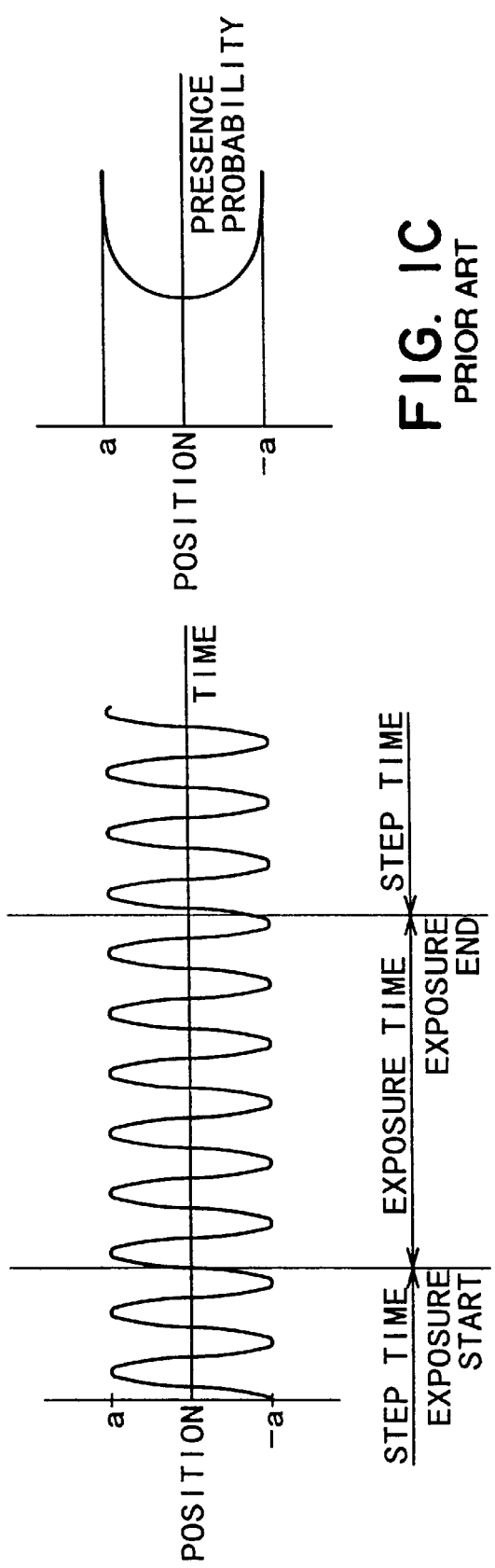

X-RAY EXPOSURE APPARATUS

FIELD OF THE INVENTION AND RELATED ART

This invention relates to an X-ray exposure apparatus for use in a lithographic process in manufacture of a semiconductor memory, for example, using exposure light such as an X-ray beam, particularly, synchrotron radiation.

X-ray exposure apparatuses generally have a structure that an X-ray source is placed in a vacuum ambience while the exposure apparatus is placed in an atmosphere or a reduced pressure ambience. At the interface between them, an X-ray window which can transmit desired X-rays but which can serve as a pressure partition wall is disposed. Such X-ray window uses a beryllium film. Since the production of a beryllium film uses a rolling process, there may occur small non-uniformness in thickness or in density of a few microns to a few millimeters. Such non-uniformness of thickness is adversely influential to the X-ray transmission factor, causing non-uniformness of intensity in the illumination X-ray beam in the X-ray exposure apparatus. Since such non-uniform intensity is directly transferred to a resist, exposure non-uniformness is produced.

Some proposals have been made against such problem. Japanese Published Patent Application, Publication No. 64451/1993 proposes a method wherein a window frame having a beryllium film adhered thereto is vibrated to cause vibration of the beryllium film, to thereby reduce the non-uniformness in the transmission factor. FIG. 1A shows a structure based on this method. In the drawing, there are an X-ray introduction tube 61 at an X-ray radiation source and another X-ray introduction tube 62 at an exposure apparatus side, and a partition wall 63 is formed between these introduction tubes. The partition wall 63 has an opening hole 63a for passing an X-ray beam 64 therethrough. Inside the X-ray introduction tube 62 of the exposure apparatus, a window frame 66 having a beryllium film 65 fixed thereto is held by a holder 67. The window frame can be vibrated in directions perpendicular to an X-ray radiation orbital plane. A vibrating mechanism therefor comprises a vibrating drive means 68 connected to the holder 67 through a transmitting means 69. The vibrating drive means 68 is disposed outside the X-ray introduction tube 62 of the exposure apparatus. Further, an edge portion of the opening hole 63a of the partition wall 63 as well as the window frame holder 67 are gas-tightly connected to each other, by means of a bellows 70, such that the vacuum ambience at the X-ray light source side is maintained.

Further, Japanese Laid-Open Patent Application, Laid-Open No. 100049/1992 shows a specific example of a window vibration width of 5 mm, a reciprocation frequency of 1 Hz, and an exposure time of 10 min.

However, where vibration is applied to an X-ray window as proposed conventionally, there occur undesirable problems as follows.

When it is assumed that the vibration is simple oscillation with an amplitude $2a$ and a period $\lambda$, the vibration can be defined as follows:

$$y = a\cos\frac{2\pi}{\lambda}(t+\theta)$$

In this vibration, the probability of existence is expressed by the following equation:

$$P(y) = \frac{1}{\pi\sqrt{a^2 - y^2}}$$

FIG. 1B illustrates the window position as represented by these equations, and FIG. 1C shows the probability of existence. As seen from these drawings, when vibration is made, there is a second whereat motion is stopped momentarily at the reverse for the reciprocal movement. In an idealistically triangular wave motion, there is no such moment included. However, it is very difficult to vibrate a particle having a mass in accordance with an idealistic triangular wave. Practically, the vibration follows a sine wave or a wave close to it. Namely, it follows a wave such as shown in FIG. 1B. If an exposure process is performed while such vibration is applied to an X-ray window, the probability of existence becomes uneven during a single exposure time period. As a result, non-uniform transmissivity information at zero-speed positions, at the opposite ends of the vibration, is transferred to a resist. Where vibration of repeated reciprocations is applied during the exposure time period, the probability of existence of the window position is largely collected at the opposite ends of vibration. Consequently, the exposure time at the opposite ends of vibration of the X-ray window is prolonged, and thus a resultant exposure illuminance distribution becomes like one to be produced when X-ray windows are held at the opposite ends of vibration and exposure amounts there are combined. For these reasons, non-uniformness of exposure can not be removed sufficiently.

In regard to the relation between the exposure time and the vibration period, if vibration is made at a period shorter than the exposure time, similar problems as described above will arise. If vibration is made at about a period corresponding to the exposure time, it means that there is at least one reverse during the exposure. Thus, non-uniform transmissivity information at that position is transferred to a resist. Particularly, in an exposure process using synchrotron radiation the intensity of the synchrotron radiation light may be attenuated with time, and in that occasion the exposure time has to be prolonged in inverse proportion to it. Namely, the ratio of the exposure time period and the non-exposure time period changes with time. In such cases, it is difficult to hold an optimum relation between the exposure time and the vibration of the X-ray extracting window.

In Japanese Laid-Open Patent Application, Laid-Open No. 100049/1992 mentioned above, the vibration width of the X-ray window is about 5 mm. However, it needs a very complicated mechanism for vibrating an X-ray window (which should function also as a pressure partition) by several millimeters or several ten millimeters. If such a large vibration is applied, vibration components will be propagated to the major assembly of the exposure apparatus, causing adverse influences to the exposure process. The structure of the exposure apparatus will be more complex since some measures have to be taken to prevent it. Further, in order to allow vibration application, the X-ray window should be fixed flexibly by means of a bellows, for example. If the amplitude is large, it causes fatigue of the bellows which may lead to breakage of vacuum.

SUMMARY OF THE INVENTION

It is an object of the present invention to provide an X-ray exposure apparatus by which non-uniformness of exposure to be produced by non-uniformness of transmission factor of an X-ray extracting window can be averaged uniformly and assuredly, such that the non-uniformness of exposure can be reduced sufficiently.

It is another object of the present invention to provide an X-ray exposure apparatus by which the structure can be simplified and by which the cost can be decreased significantly.

It is a further object of the present invention to provide an X-ray exposure apparatus by which any load applied to a bellows can be reduced, such that the apparatus fully meets mass-production.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1B and 1C are schematic views, respectively, for explaining the position of the X-ray window being vibrated by simple oscillation, and the probability of existence for the position.

DESCRIPTION OF THE PREFERRED EMBODIMENTS

Preferred embodiments of the present invention will now be described with reference to the accompanying drawings.
[First Embodiment]

Figure 2A:
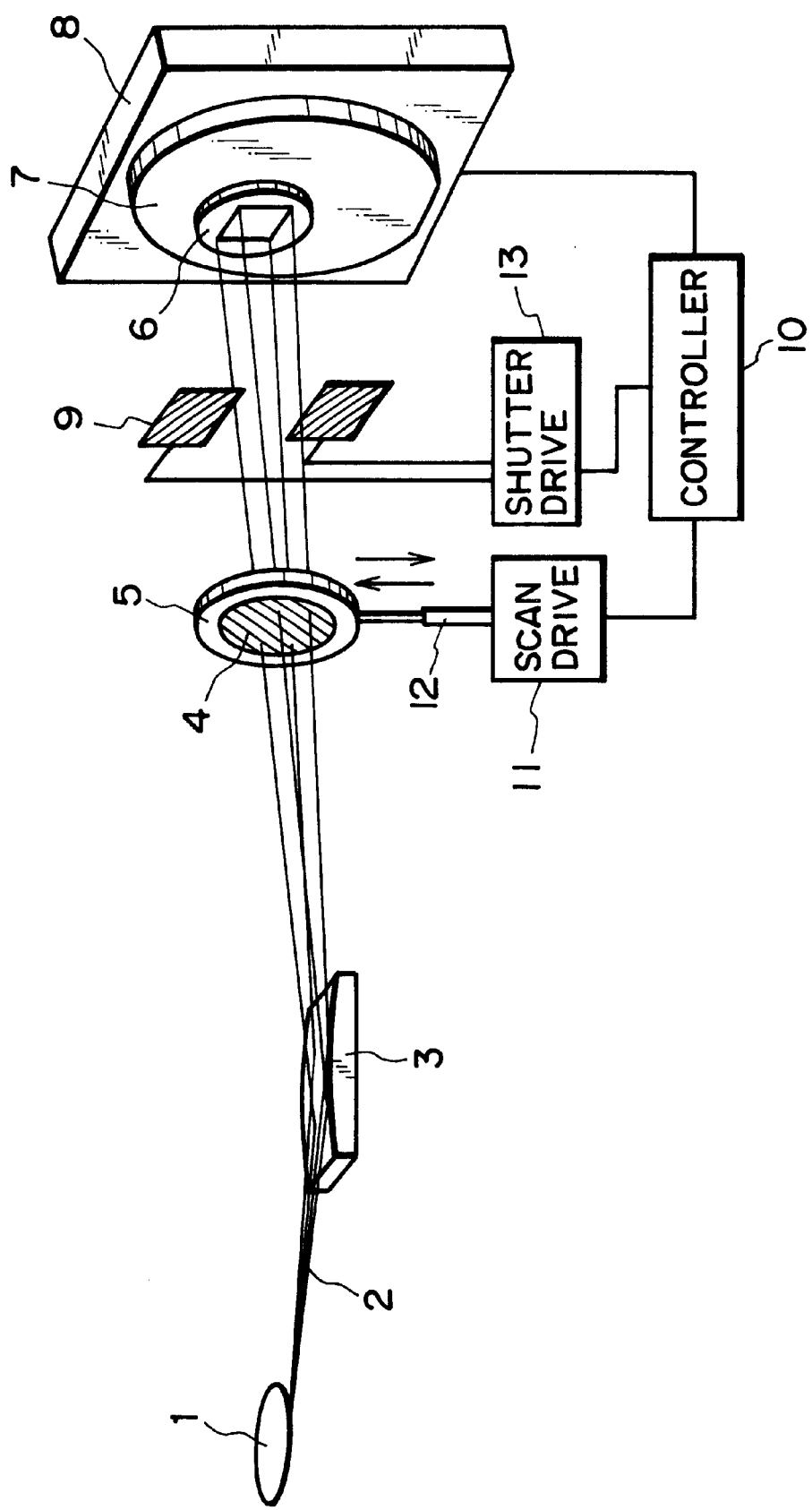
FIG. 2A is a schematic view of a general structure of an X-ray exposure apparatus according to a first embodiment of the present invention.

FIG. 2A is a schematic view of a general structure of an X-ray exposure apparatus according to a first embodiment of the present invention.

In the X-ray exposure apparatus shown in FIG. 2A, at the interface between an X-ray source disposed in a vacuum ambience and the exposure apparatus disposed in an atmospheric or reduced pressure ambience, there is an X-ray window which serves to transmit desired X-rays from the X-ray source and which can function as a pressure partition wall. The X-ray source comprises a synchrotron radiation light source 1. The X-ray beam emitted horizontally from the synchrotron radiation light source 1 is expanded, in a vertical direction, by means of an X-ray mirror 3 of a convexed surface shape, for accomplishing a required irradiation region, and then the X-ray beam passes through the X-ray window. The X-ray window comprises an X-ray window film 4 made of beryllium and a window frame 5 for holding the window film 4.

Figure 2B:
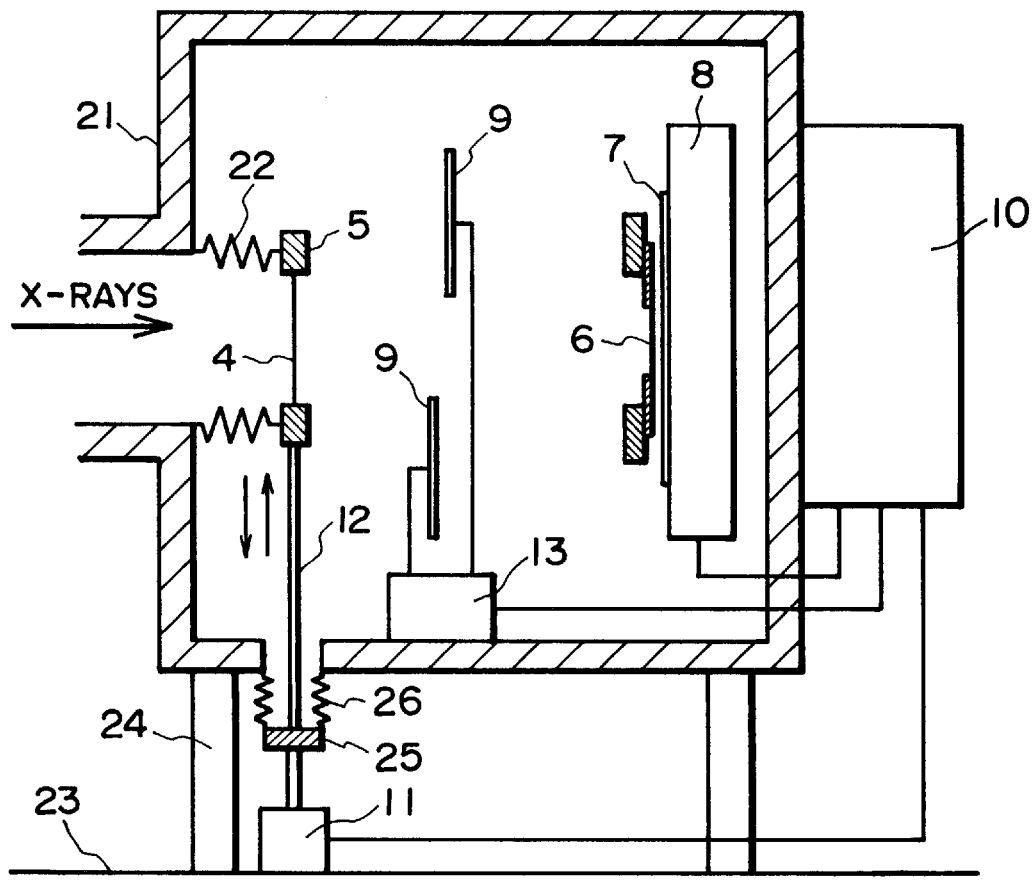
FIG. 2B is a sectional view of the structure of a portion of the X-ray exposure apparatus according to the first embodiment, around an X-ray window thereof.

FIG. 2B shows an inside structure of the exposure apparatus. A partition wall 21 of the exposure apparatus is formed with an opening through which X-rays can pass. At this opening, the window frame 5 having its beryllium window film 4 attached thereto is mounted by using a bellows 22. The bellows 22 functions to gas-tightly connect the window frame 5 and the edge portion of the opening of the partition wall 21 with each other. Also, it supplies a degree of freedom, allowing movement of the window frame 5. Inside the apparatus, there is a wafer stage 8 for holding a wafer 7 and for moving it to an exposure station. Disposed above the wafer 7 is an X-ray mask 6. There is a shutter 9 disposed between the X-ray mask 6 and the X-ray window film 4, for controlling the exposure time. The shutter 9 can be opened and closed, by means of a driving system 13 disposed inside the apparatus.

The exposure apparatus of the structure described above is fixedly mounted on a floor 23, through legs 24. The beryllium film 4 can be scanningly moved in directions perpendicular to the radiation orbital plane of the synchrotron. In this embodiment, the window frame 5 inside the apparatus is connected to an X-ray window scan drive system 11 mounted on the floor 23, outside the apparatus, through drive transmitting means 12, by which the window frame 5 can be scanningly moved in the direction described above. The wall structure of the apparatus is formed with a bore through which the drive transmitting means extends. By using a flange 25 fixed to the drive transmitting means 12 as well as a bellows 26, the bore is gas-tightly sealed. Outside the exposure apparatus, there is a controller 10 for controlling the wafer stage 8, the X-ray window scan drive system 11 and the shutter driving system 13.

Figure 1A:
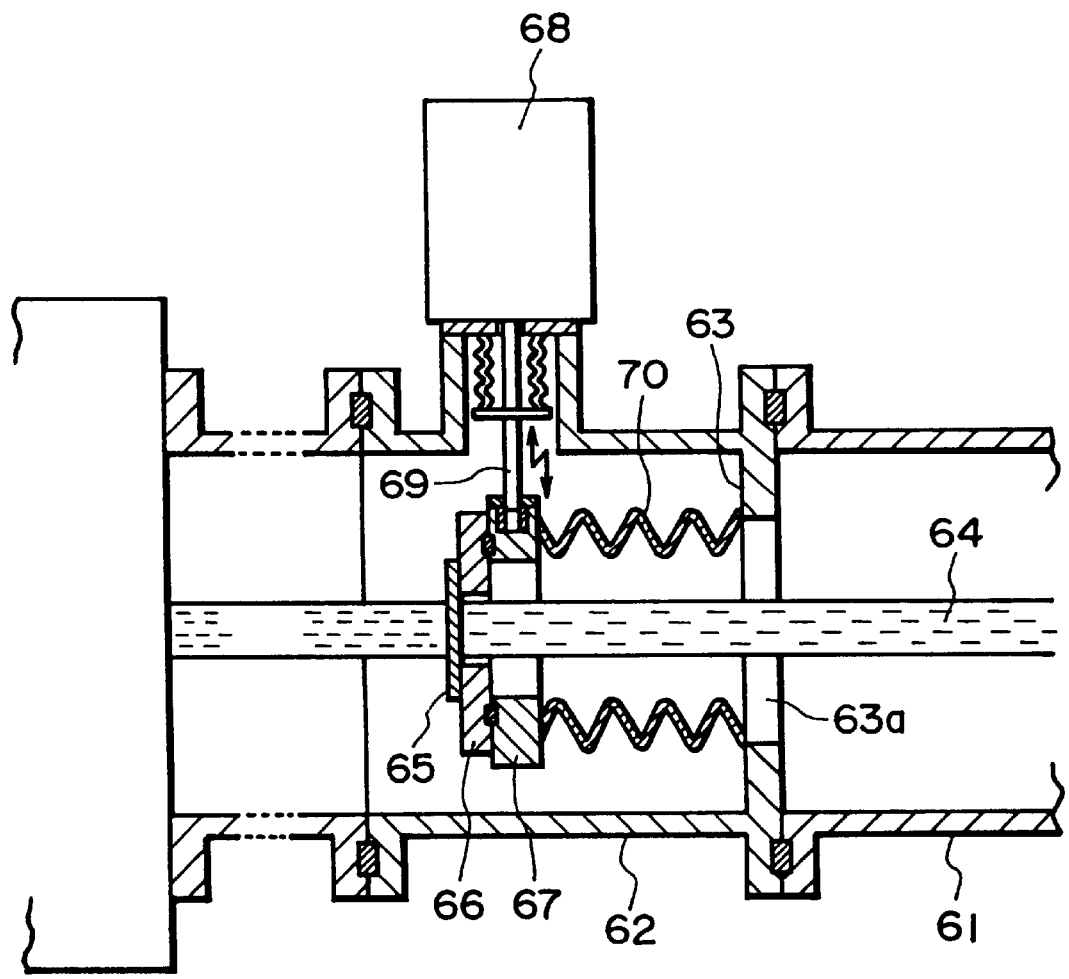
FIG. 1A is a sectional view of a structure of a conventional X-ray exposure apparatus, in a portion around an X-ray window.

In the exposure apparatus of the structure described above, a synchrotron radiation beam from the synchrotron radiation light source 1 is expanded by the convex mirror 3 in a direction perpendicular to the synchrotron radiation orbital plane, to ensure a required area. Then, the radiation beam passes through the X-ray window film 4 and it is introduced into the exposure apparatus. The radiation beam is projected onto the X-ray mask 6, such that a pattern formed on the mask 6 is transferred onto the wafer 7. If in this process the X-ray window film 4 of the X-ray exposure apparatus has non-uniformness in its transmission factor, the illuminance of X-rays projected on the mask becomes non-uniform and it causes non-uniform exposure. This embodiment uses a method wherein the X-ray window is scanningly moved by which such non-uniformness of exposure can be reduced. In the structure described with reference to FIG. 1A, the X-ray window is vibrated by which the exposure non-uniformness is reduced. Differences of the present embodiment and the conventional structure will be described below, in detail.

Assuming that an X-ray window has non-uniformness of a certain period, the method for suppressing the exposure non-uniformness through vibration of the X-ray window will be considered first.

It is now assumed that an X-ray window film (beryllium film) has a non-uniformness of transmissivity which can be expressed by the following equation:

$$f(x)=f_0+f_1 \sin(2\pi x/\lambda)$$

where $\lambda$ is the period of the non-uniformness. If the film moves by a displacement $x_0(t)$ as a function of time, it is expressed as follows:

$$f(x)=f_0+f_1 \sin\{2\pi(x+x_0(t))/\lambda\}$$

Here, if the displacement $x_0(t)$ is simple oscillation, then:

$$x_0(t)=x_0 \sin(\omega t)=x_0 \sin(2\pi t)$$

In this case, from the simple oscillation $x_0(t)$, the non-uniformness as averaged is given by:

$$\langle f\langle x\rangle\rangle = \frac{1}{T}\int_{-\frac{T}{2}}^{\frac{T}{2}} dt\left\{f_0 + f_1 \sin\left(\frac{2\pi(x+x_0(t))}{\lambda}\right)\right\}$$

$$= f_0 + J_0\left(\frac{2\pi x_0}{\lambda}\right) f_1 \sin\left(\frac{2\pi x}{\lambda}\right)$$

where $J_0(2\pi x_0/\lambda)$ is a zero-th order Bessel function. When the vibration is large as compared with the period of non-uniformness, the following asymptotic expansion applies:

$$J_0\left(\frac{2\pi x_0}{\lambda}\right) \xrightarrow{x_0 \gg \lambda} \sqrt{\frac{2}{\pi z}} \cos\left(z - \frac{\pi}{4}\right)\bigg|_{z=\frac{2\pi x_0}{\lambda}}$$

$$= \frac{1}{\pi}\sqrt{\frac{\lambda}{x_0}} \cos\left(\frac{2\pi x_0}{\lambda} - \frac{\pi}{4}\right)$$

$$\propto \sqrt{\frac{\lambda}{x_0}}$$

Thus, the non-uniformness is proportional to $\sqrt{\lambda/x_0}$. This means that, if an amplitude $x_0$ ten times larger than the period $\lambda$ of the transmissivity non-uniformness is applied thereto, the non-uniformness become equal to $1/\sqrt{10}$. Namely, it becomes about one-third.

On the other hand, the state of non-uniformness in a case where an X-ray window having a similar non-uniformness in its transmission factor is scanningly moved in one direction, at a constant speed and by a length similar to the amplitude of the vibration, will now be considered.

Like the preceding case, it is assumed that the X-ray window film has a non-uniformness of transmissivity which can be expressed by the following equation:

$$f(x)=f_0+f_1 \sin(2\pi x/\lambda)$$

If the film moved by a displacement $x_0(t)$ as a function of time, it is expressed by the following equation:

$$f(x)=f_0+f_1 \sin\{2\pi(x+x_0(t))/\lambda\}$$

If the displacement $x_0(t)$ is made without interruption and the scan is made at a constant speed, it follows that:

$$x_0(t)=2x_0/T$$

The probability of existence in this case is:

$$\langle f\langle x\rangle\rangle = \frac{1}{T}\int_{-\frac{T}{2}}^{\frac{T}{2}} dt\left\{f_0 + f_1 \sin\left(\frac{2\pi(x+x_0(t))}{\lambda}\right)\right\}$$

$$= f_0 + \frac{\lambda}{2\pi x_0}\sin\left(\frac{2\pi x_0}{\lambda}\right) f_1 \sin\left(\frac{2\pi x}{\lambda}\right)$$

Thus, the non-uniformness is proportional to $\lambda/x_0$.

This means that, like the preceding case, the non-uniformness can be reduced to one-tenth, by performing the scan through a length ten times larger than the period $\lambda$ of the transmissivity non-uniformness. It means that the non-uniformness reducing effect is remarkably higher than that attained in the case of simple oscillation (about one-third). The effect becomes more notable, in the present scan method, if the period of non-uniformness is smaller than the amplitude of vibration. Namely, it is seen that the non-uniformness reducing effect is quite large in the X-ray window scan method, as compared with in the X-ray window vibration method.

Figure 3:
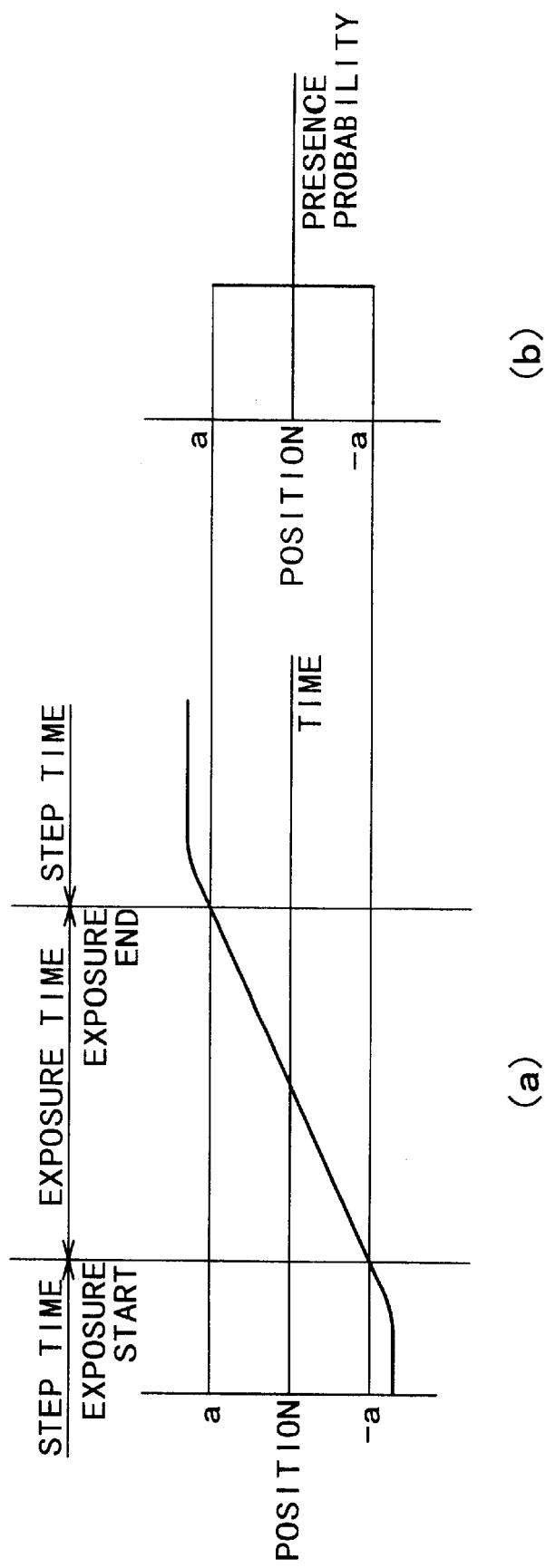
FIG. 3 is a graph for explaining the position of the X-ray window when scanned in one direction, in the X-ray exposure apparatus of the first embodiment, and the probability of position existence thereof.

FIG. 3, a portion (a), shows the relation between the exposure time and the position of the X-ray window, in this embodiment. It is seen from the drawing that, in this embodiment, during the exposure time, the X-ray window is scanningly moved at least in one direction without interruption or stoppage. The words "at least in one direction" mean that the scan may be made by a curved motion. What is essential is that the motion is made without interruption during the exposure time. The scan direction may be in any direction, provided that it is perpendicular to the optical axis of exposure X-ray beam. In a case of simultaneous exposure using a synchrotron radiation as expanded in a direction perpendicular to the orbital plane, more advantageous results are obtainable if the scan is made in a direction perpendicular to the synchrotron radiation orbital plane. This is because, since the apparent light source shape is expanded along the synchrotron radiation orbital plane, an averaging effect due to the size of the light source appears with respect to a direction along the orbital plane. Making straight scan along a direction perpendicular to the synchrotron radiation orbital plane does not require a driving system of complicated structure. Also, as seen from FIG. 3, a portion (b) thereof, the relation between the position of the X-ray window and the probability of existence becomes constant. Therefore, the non-uniformness of exposure attributable to the X-ray window can be reduced effectively.

Sequential operations in the exposure sequence to be made in the exposure apparatus of this embodiment, will now be explained. First, an unexposed wafer is supplied from a wafer supply source (not shown) disposed outside the exposure apparatus or annexed to the exposure apparatus, and it is loaded on the wafer stage 8, for preparation of exposure. During this period, the exposure shutter 9 is kept closed, and no exposure X-ray beam is projected to the X-ray mask 6 or the wafer 7. Subsequently, after the exposure preparation is completed and the wafer stage 8 is moved to a first exposure position with respect to the wafer 7, corresponding information is applied to the controller 10 of the exposure apparatus, such that the readiness for exposure process is discriminated by the controller 10. In response thereto, the controller 10 applies a scan start signal to the scan drive system 11 for the X-ray window. The window frame 5 and the window film 4 do not move until this signal is supplied. After the X-ray window film 4 starts its motion, the controller 11 supplies a shutter opening signal to the shutter driving system 13, in response to which the exposure process starts. After an exposure amount necessary for sensitizing a resist, applied to the wafer 7 surface, is projected, the shutter 9 is closed. After the shutter 9 is closed, the X-ray window film 4 is stopped. The window film is kept at that position, waiting for completion of motion of the wafer stage 8 to a subsequent exposure position. Then, just before start of the subsequent exposure process, the scan motion starts. Thereafter, the shutter is opened, and the exposure process starts. When the shutter 9 is closed and the exposure process is completed, the X-ray window film 4 is stopped. In this manner, the X-ray window film is scanningly moved in alternate or opposite directions in alternate exposures. After all the exposures for a single wafer are completed, the X-ray window film is held at that position until preparation for a first exposure to a subsequent wafer is completed.

Scanning the X-ray window in one direction in a single exposure, as in this embodiment, provides further advantageous effects such as follows.

If vibration of an amplitude 5 mm is applied 600 times during a single exposure, as in the conventional structure described hereinbefore, fatigue of a bellows may shortly occur. Although a bellows may be designed to have a durability to vibration of a million times, for example, with respect to a normal amplitude, the durability a million times will be easily exceeded by exposure operations of only about 1,700 times. This is a large bar for use of the exposure apparatus for mass-production. If, on the other hand, the X-ray window is scanningly moved in one direction in a single exposure and, additionally, it is held stopped during the non-exposure period, as in the present embodiment, according to simple calculations, exposure operations of two million times may be allowed. This is much better than the method wherein reciprocal vibration is repeated many times during a single exposure process.

Although the embodiment described above is most efficient, what is essential is that the X-ray window is scanningly moved without interruption during a single exposure process. Therefore, it is a possible embodiment that the window position is returned at each exposure such that the scan motion is made constantly in the same direction. Namely, a sequence for moving back the window along a direction opposite to the scan direction, during a non-exposure period, may be included.

[Second Embodiment]

The embodiment described above is arranged so that, in the step-and-repeat exposure procedure for sequentially exposing one wafer, the X-ray window is scanningly moved in alternate directions in each exposures. However, in a case where the distance for scan motion of the X-ray window is not long or a case where the time period between successive exposures is very short, the scan direction of the X-ray window should not always be reversed in each exposures.

Figure 4:
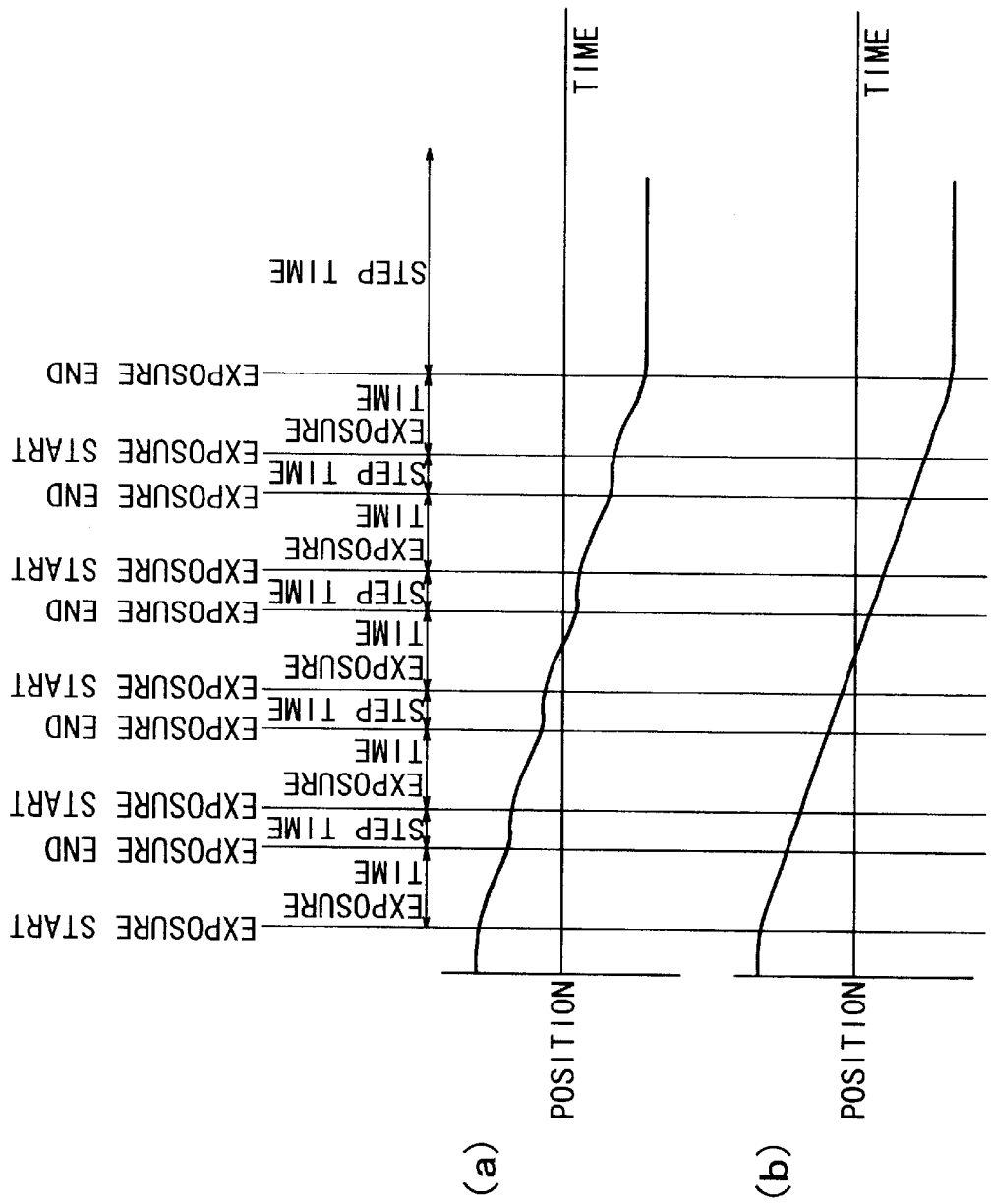
FIG. 4 is a graph for explaining the position of an X-ray window when scanned in one direction, in an X-ray exposure apparatus according to a second embodiment of the present invention, and the probability of position existence thereof.

For example, if a length of about 1 mm is sufficient for scanning the X-ray window, first the scan of the X-ray window may be started before start of the exposure, and after that, the shutter may be opened to start the exposure. The X-ray window may be scanned and moved by 1 mm during the exposure time period, and then the exposure may be completed as the shutter is closed. Then, the X-ray window may be stopped. Before start of a subsequent exposure, the X-ray window may be scanningly moved in the same direction, and may perform scan of 1 mm during the exposure. The above-described operations may be repeated five times. There may be preparatory run before each exposure and deceleration after each exposure, the X-ray window may move about 7 mm. From the sixth time exposure, the X-ray window may be scanningly moved in an opposite direction, by 1 mm for each exposure. FIG. 4, a portion (a) thereof, illustrates this. If the interval between successive exposures is very short, the X-ray window should not always be stopped in response to completion of each exposures. It may be continuously moved in the same scan direction, during the five exposures described above. FIG. 4, a portion (b) thereof, illustrates it. What is required is that the shutter is opened in a state in which the X-ray window is not stopped; that, while the shutter is opened, the X-ray window is scanningly moved without interruption; and that the shutter is closed at least during the scan. As a matter of course, the number of successive exposures is not limited to five.

[Third Embodiment]

Figure 5:
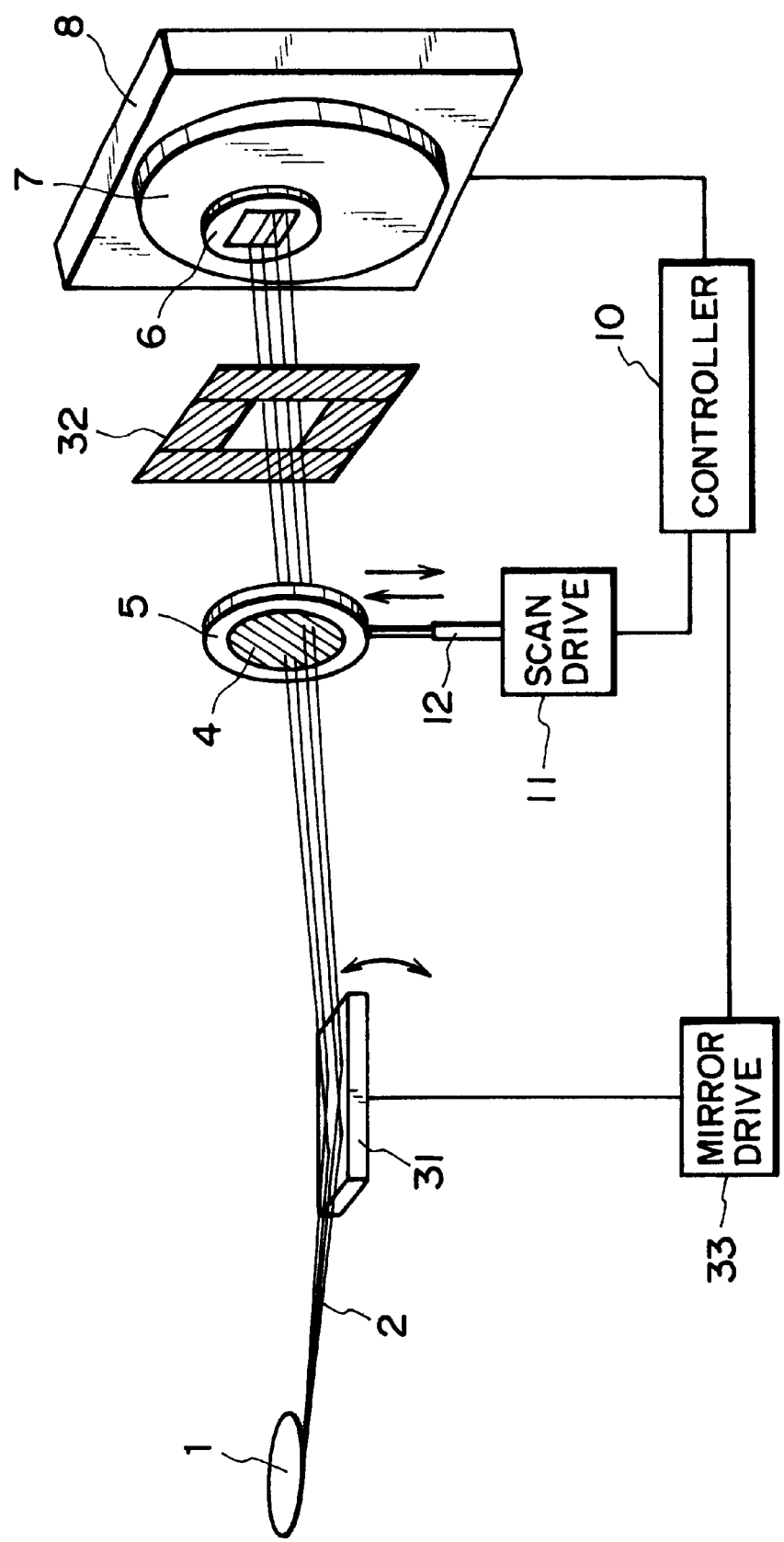
FIG. 5 is a schematic view of a general structure of an X-ray exposure apparatus according to a third embodiment of the present invention.

While the first embodiment is arranged so that the synchrotron radiation beam is expanded by a convex mirror in a direction perpendicular to the synchrotron radiation orbital plane, to allow simultaneous exposure of a required exposure region, the present invention is not limited to this form of X-ray exposure apparatus. FIG. 5 is a schematic view of an X-ray exposure apparatus according to another embodiment of the present invention.

The X-ray exposure apparatus according to the embodiment shown in FIG. 5, also, uses a beryllium window film 5 which serves to transmit desired X-rays from a synchrotron radiation light source 1 and which functions as a pressure partition wall. The X-ray beam emitted horizontally from the synchrotron radiation light source 1 is scanningly deflected by a movable mirror 3 in a direction perpendicular to the synchrotron radiation orbital plane, and it passes through the X-ray window film 4. The film 4 is held by a window frame 5, and it can be scanningly moved in a direction perpendicular to the synchrotron radiation orbital plane, by means of an X-ray window scan drive system 11 which is connected to the window frame 5 through drive transmitting means 12.

Inside the exposure apparatus which is isolated from the synchrotron radiation source side by the interface defined by the X-ray window film 4, there is a wafer stage 8 for holding a wafer 7 and for moving it toward the exposure station. Disposed above the wafer 7 is an X-ray mask 6. There is a light blocking means 32 for regulating a single exposure region, disposed between the X-ray mask 6 and the X-ray window film 4.

Disposed outside the exposure apparatus is a controller 10 for controlling the wafer stage 8, the X-ray window scan drive system 11 and a driving system 33 for producing swinging motion of the mirror 3.

In this embodiment, the invention is applied to a scan exposure method wherein a synchrotron radiation beam is scanningly deflected (beam scan) in a direction perpendicular to the synchrotron radiation orbital plane to obtain a desired exposure region. Since what is essential in this embodiment is scanningly moving the X-ray window, scanning the synchrotron radiation beam (scanning deflection) as in this embodiment will be referred to as "beam scan", for distinguishing them.

As regards an exposure system using such beam scan, proposals have been made to an arrangement wherein an X-ray window is scanningly moved together with the beam. In many of these proposals, the size of the X-ray window is made close to the beam size, to thereby increase the mechanical strength of the X-ray extracting window. This embodiment of the present invention is completely different from such structure. That is, in this embodiment, the X-ray window has a shape that covers a single exposure region.

An advantage of use of an X-ray exposure apparatus is that a large exposure field (picture angle) is obtainable. This is also the reason for use of beam scanning. Specifically, a single exposure area is approximately in a range of 30–50 mm square. If an X-ray window of a shape close to a sheet beam is to be scanningly moved, together with the sheet beam, to perform exposure of a wide region such as above, a scanning distance of 30 mm or more is necessary. Moving an X-ray window which functions also as a vacuum partition applies a large load to the mechanism of the exposure apparatus. In this embodiment, for the reason described above, an X-ray window of a size that covers a single exposure region is used. As a result of this, the scan length can be minimum as required for reducing the exposure non-uniformity. Therefore, the scan mechanism can be made very simple. Further, regardless of the beam scan direction or the times of beam scanning operation, the X-ray window performs one scan for each exposure. In this embodiment, like the preceding embodiment, the procedure is done in accordance with a sequence that the scanning motion of the X-ray window starts just before start of the exposure, and, after the beam scan is performed and completed, the scan of the X-ray window is stopped.

In the embodiments described hereinbefore, preferably the X-ray window has an area, in the scan direction, wider than the required exposure region by an amount corresponding to the scan length through which the scan is made during the exposure process.

[Fourth Embodiment]

Next, a scan method for a case where the exposure condition is changed due to a change in type of a resist or a mask to be used in X-ray lithography, or for a case where the exposure time is changed due to a change in intensity of synchrotron radiation caused by a change in accumulated current of the synchrotron radiation, will be explained.

As described hereinbefore, there is individual variations in the non-uniformness of thickness of beryllium films, and thus there is a large dispersion of the period and magnitude of the non-uniformness. Further, as regards the non-uniformness of intensity of the exposure X-ray beam at the exposure station to be produced by the non-uniformness of transmissivity, there are not only the period of non-uniformness of transmissivity of the beryllium film but also such period with which the exposure non-uniformness is emphasized depending on the distance between the X-ray window and the exposure position (wafer or workpiece). Such period of exposure non-uniformness can be regarded as being peculiar to that exposure apparatus including the X-ray window. Then, the length (distance) for the scan of X-ray window required for making the exposure non-uniformness sufficiently small can be determined accordingly. Namely, in order that the X-ray exposure non-uniformness is reduced effectively, not only scanning the X-ray window is necessary but also the length for scan during the exposure time is important. As described above, in X-ray exposure, the exposure time is changeable for some reason. Thus, scanning at a constant speed may not always assure an optimum scan width during the exposure time.

In this embodiment, in consideration of the above, an additional function is provided in the scan drive system for the X-ray window, by which the window scan speed can be changed in accordance with the exposure time. If the exposure time is short, the X-ray window scan speed is made larger, such that a necessary length (distance) can be scanned within the exposure time. If the exposure time is prolonged, the X-ray window scan speed is made slower, such that a predetermined length (distance) can be scanned by spending the whole of the exposure time.

In accordance with the first to fourth embodiments described above, the X-ray window is scanningly moved without interruption during the exposure, by which a constant probability of existence for the position of the X-ray window is assured. With this arrangement, non-uniformness of X-ray intensity to be produced at the exposure position due to non-uniformness of X-ray transmissivity can be reduced effectively.

In the fifth to seventh embodiments to be described below, the length (distance) for X-ray window scan necessary for making the exposure non-uniformness sufficiently small, will be explained.

[Fifth Embodiment]

Figure 6:
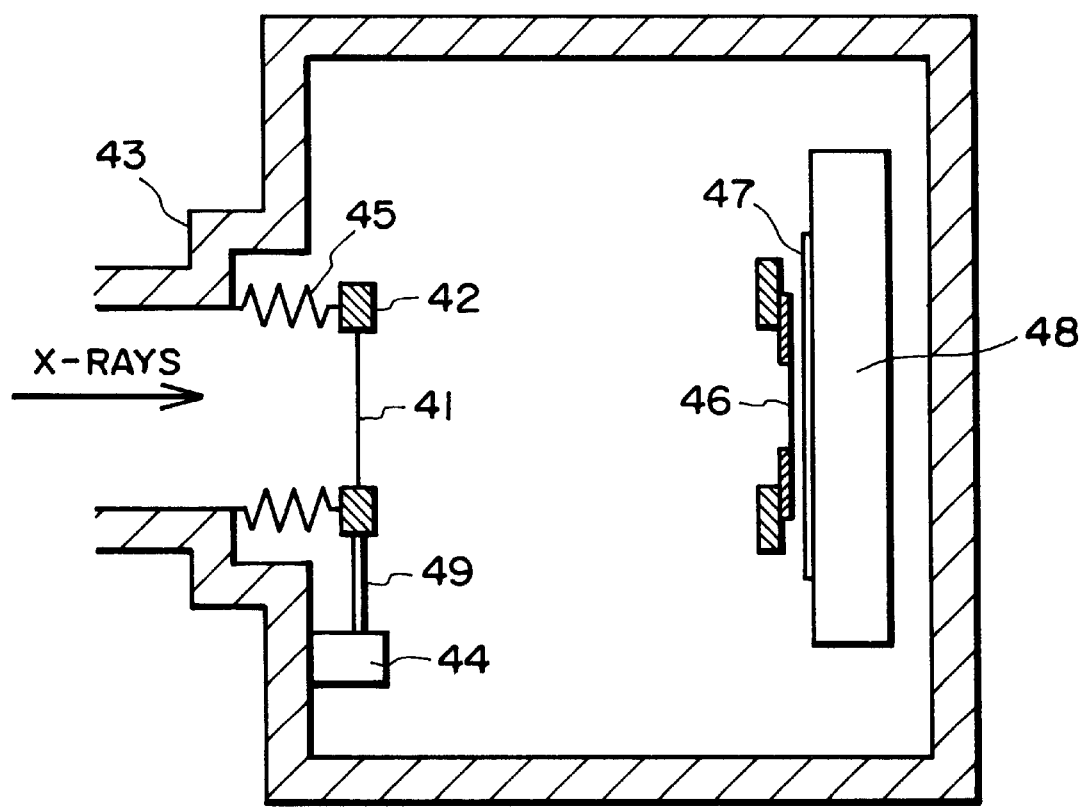
FIG. 6 is a sectional view for explaining an inside structure of a portion of an X-ray exposure apparatus according to another embodiment of the present invention.

FIG. 6 is a sectional view of an inside structure of an X-ray exposure apparatus according to a fifth embodiment of the present invention. As illustrated, a partition wall 43 of the exposure apparatus serves to provide a gas-tight insulation against the X-ray light source side (not shown), and it is formed with an opening through which X-rays can pass. At this opening, a window frame 32 having a beryllium window film 41 attached thereto is mounted by using a bellows 45. The bellows 45 functions to gas-tightly connect the window frame 42 and the edge portion of the opening of the partition wall 43 with each other. Also, it supplies a degree of freedom, allowing movement of the window frame 42. Inside the apparatus, there is a wafer holding mechanism 48 for holding a wafer 47 and for moving it to an exposure station. Disposed above the wafer 47 is an X-ray mask 46.

The X-ray window film 41 can be scanningly moved in directions perpendicular to the radiation orbital plane of the synchrotron. In this embodiment, the window frame 42 is connected to a scanning mechanism 44, such as a motor, for example, disposed inside the apparatus, through drive transmitting means 49, by which the X-ray window film 41 can be scanningly and minutely moved in the direction described above.

As described hereinbefore with respect to conventional structures, in an X-ray exposure apparatus, there may occur non-uniformness of intensity of X-rays at the exposure position due to an X-ray window of the apparatus. This is because of that the thickness of the X-ray window film 11 is not even and there is non-uniformness of thickness. Since the X-ray transmission factor is inversely proportional to the thickness, non-uniformness of intensity results.

However, the inventors of the subject application have found that there is a difference between an intensity distribution of transmitted X-rays at a position close to the X-ray window and an intensity distribution of transmitted X-rays at a position away from the X-ray window by a certain distance. More specifically, according to experiments, the inventors have found a phenomenon that, depending on the distance between an X-ray window film 41 and a wafer (article to be exposed) 47, the intensity non-uniformness of exposure X-rays upon the wafer 47 changes. Particularly, a large non-uniformness of intensity of the exposure X-ray beam of a period of about 10–100 microns was detected, and it has been found that the period of large non-uniformness of exposure X-ray intensity changes with the distance between the X-ray window film 41 and the wafer 47.

An explanation may be given to this phenomenon that, as the X-rays pass through the beryllium film, there occurs a phase shift depending on a difference in thickness, and that the phases mutually strengthen or weaken at a certain distance, to cause it. Practically, the non-uniformness of thickness of the beryllium window film is random and it has no periodicity and, therefore, it can be regarded as a combination of various periods. Thus, it may be considered that, depending on the distance, those periods which mutually strengthen are detected largely, and that, as a result of this, the period of non-uniformness of the X-ray intensity to be detected strongly is variable in dependence upon the change in distance.

It has been found that the period of non-uniformness of X-ray intensity detected strongly is about a root square of $2*\lambda*L$, where $\lambda$ is the wavelength of X-rays and L is the distance between the X-ray window and the wafer. This can be derived from the calculation while taking into account the phase difference described above, as a mutually strengthening condition. In practice, the inventors have confirmed a phenomenon that, at a wafer position spaced by 500 mm, the non-uniformness of X-ray intensity is about 20% at the maximum.

The embodiment to be described below is specifically arranged to suppress a phenomenon that, among the exposure intensity non-uniformness attributable to the non-uniformness of thickness of the beryllium window film, the non-uniformness of exposure intensity becomes larger than the non-uniformness of transmissivity for the reason described above, such that the exposure non-uniformness can be reduced.

Figure 7:
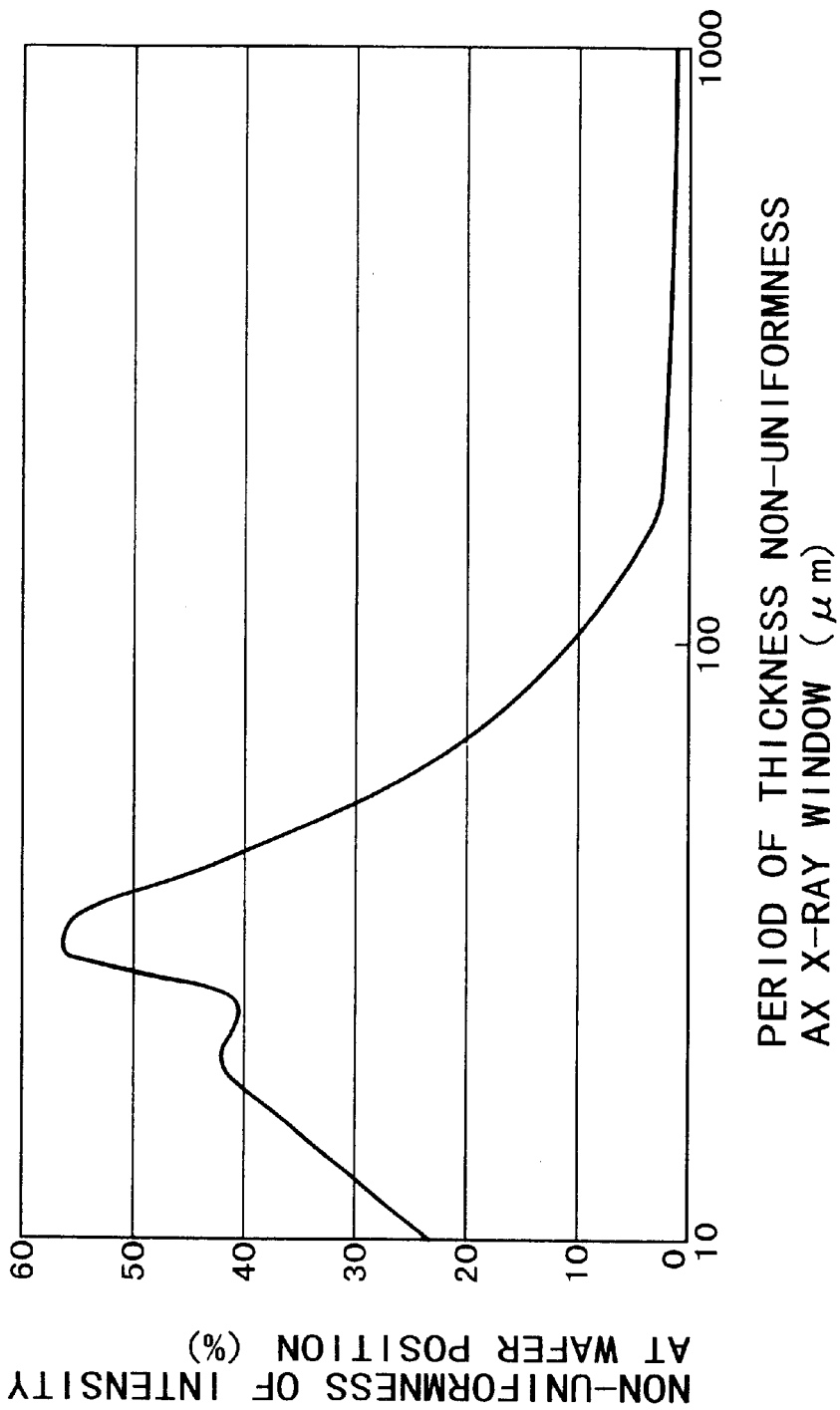
FIG. 7 is a graph for explaining occurrence of non-uniformness of X-ray intensity upon a wafer disposed with a space from an X-ray window of an X-ray exposure apparatus, to be caused by non-uniformness of X-ray transmission factor of the X-ray window, the X-ray intensity non-uniformness being calculated in accordance with non-uniformness in thickness of the X-ray window.

FIG. 7 is a graph for explaining that non-uniformness of X-ray transmissivity of a beryllium window film causes non-uniformness of X-ray intensity at a certain distance from the beryllium window film, the graph being based on calculations made in accordance with the period of the thickness non-uniformness. More specifically, the graph shows the results of calculations made to the magnitude of the non-uniformness of X-ray intensity at a position spaced by 500 mm from the beryllium film, in a case where the beryllium window film has a certain non-uniformness of thickness given by a sine function.

In this example, since a peak wavelength of synchrotron radiation X-rays where the intensity distribution with respect to the wavelength of X-rays passed through the X-ray window film has a largest intensity, is about 1 nm, while taking this value as a representative, calculations were made with respect to 1 nm. Also, the light source was assumed as a point light source. A largest value of intensity distribution at a distance spaced by 500 mm was calculated, with an assumption of a transmissivity non-uniformness of 1%. In this example, if the period of the transmissivity non-uniformness (thickness non-uniformness) becomes longer, the magnitude of non-uniformness of X-ray intensity becomes equivalent to the magnitude of non-uniformness of the transmission factor. Further, although it is not illustrated, if the period of non-uniformness of transmissivity is very short, its information is blurred and the magnitude of non-uniformness of X-ray intensity becomes smaller than the magnitude of the transmissivity non-uniformness, such that the non-uniformness of transmissivity does not apply an influence. However, it is seen in FIG. 7 that the magnitude of non-uniformness of intensity in a portion where the period of thickness non-uniformness is about 10–100 microns, is very large as compared with the non-uniformness of transmission factor. The peak period lies at about 32 microns which is a value corresponding to a square root of $2*\lambda*L$. Since this calculation example is based on an assumption of using a single wavelength and a point light source, the highest value of intensity non-uniformness is 55 times or more. Practically, since the light source has a continuous wavelength and it has a certain size, the non-uniformness of intensity is weakened, and it is not amplified large as above. Particularly, when synchrotron radiation is used as a light source, the light source shape is prolonged largely in a lateral direction along the orbital plane. Therefore, it is blurred sufficiently with respect to a direction along the synchrotron orbital plane, such that the largest value of the intensity non-uniformness decreases much. By using this effect, when the X-ray window is scanningly moved in a direction perpendicular to the orbital plane, the intensity non-uniformness can be reduced effectively.

On the basis of what described above, the intensity non-uniformness of a period to be considered particularly can be determined in accordance with the distance between the X-ray window and the wafer. Thus, an effective scan width in a case where a method of reducing non-uniformness of exposure X-ray intensity by scanning the X-ray window is used, can be determined.

Figure 8:
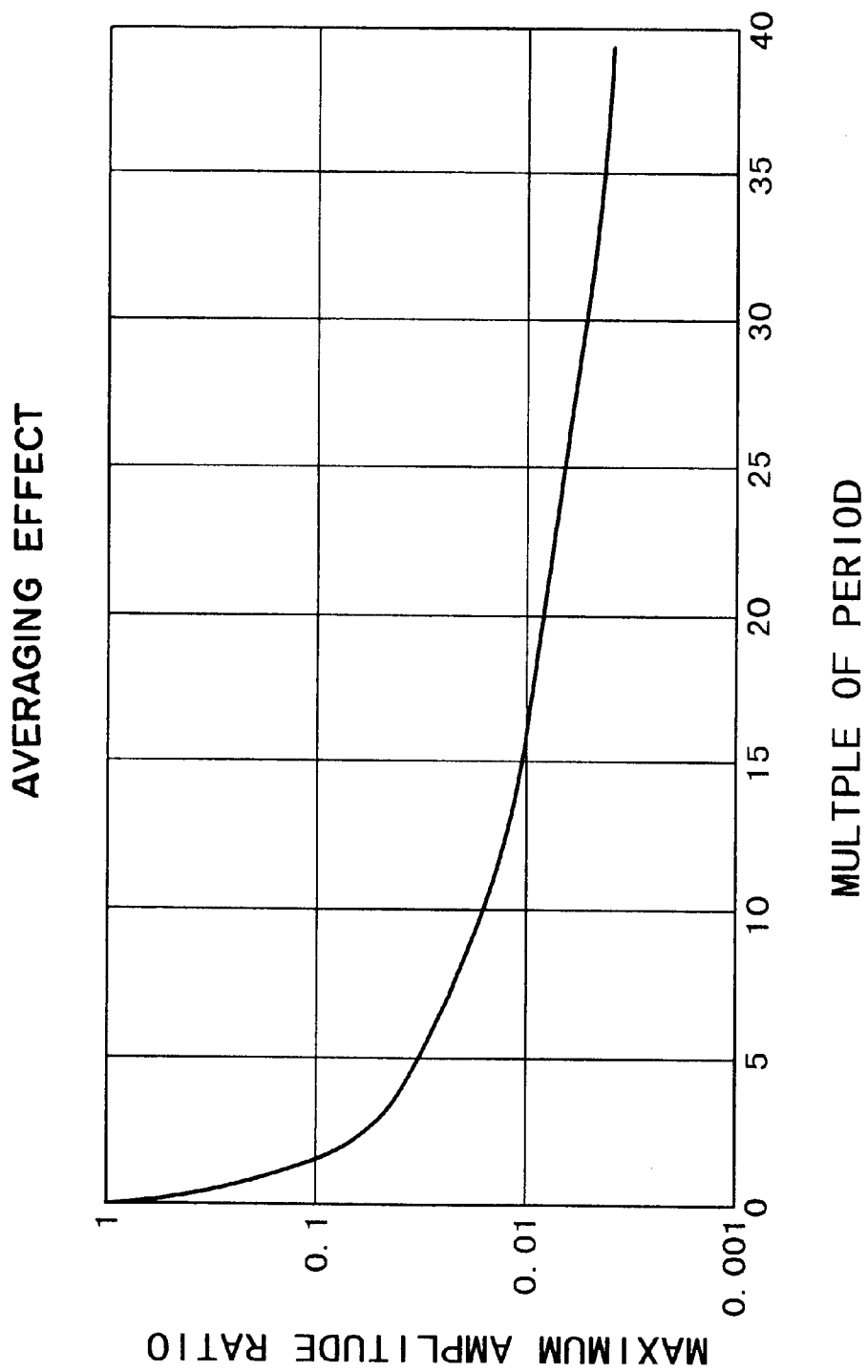
FIG. 8 is a graph for explaining an averaging effect to the amplitude when a sine wave is scanned.

FIG. 8 shows an example where calculations are made in regard to a case wherein, when a sine wave is scanned, its amplitude is averaged. The axis of abscissa denotes a multiple of the period of the sine wave, and the axis of ordinate denotes the ratio of amplitude. According to this example, with the scan of about ten times the period, the amplitude is averaged to about 1/60, and with the scan of about three times the period, the amplitude is averaged to about 1/20. Specifically, if the scan width of the X-ray window is made equal to 300 microns which is about 10 times the peak period, the intensity non-uniformness of 50% is reduced to 1% or less. Also, the intensity non-uniformness of about 10% with the period of 100 micron thickness non-uniformness (see FIG. 7) is reduced to about 0.5%, through an X-ray window scan width of 300 microns. The intensity non-uniformness of about 1.5% with 500 micron thickness non-uniformness period is reduced to about 0.5%, through a scan width of 0.6 times. From these calculations, it is seen that, when the scan width of the X-ray window is made about ten times the peak period, the non-uniformness of intensity can be reduced to the same level as a non-uniformness of transmission factor of 1%, which the X-ray window has originally. In this example, as a scan width of the X-ray window with which the intensity non-uniformness becomes equal to or smaller than 1% in calculation, a value equal to ten times the peak period is taken as a lower limit. Where the X-ray window should be scanningly moved without interruption during a single exposure, the scan width may desirably be made slightly larger than the numerical value described above to ensure that the window scan is initiated just before start of the exposure and that the window is stopped after completion of the exposure. The numerical value is not limited to those specifically mentioned above. The same advantageous effects are obtainable with a scan width ten times the square root of $2*\lambda*L$ which is a peak value.

The scan width which is ten times the square root of $2*\lambda*L$ is a minimum required condition. If the X-ray window is scanningly moved beyond the scan width according to this equation, the intensity non-uniformness amplifying function is diminished. However, an excessively large scan is not good. As described hereinbefore, if an amplitude of several millimeters is applied to the X-ray window, a drive source has to be large and there occurs a possibility of fatigue of the bellows. Although a bellows may be designed to have a durability of about a million times, for example, with respect to a normal amplitude, if it is vibrated at 10 Hz, the durability a million times is easily exceeded in about 28 hours. Even with 1 Hz, the lifetime is ten times. Thus, it can not meet mass-production. However, if the scan width of the X-ray window is made equal to 1/10 or 1/100 of the normal amplitude of the bellows, the lifetime prolongs remarkably.

Also from this viewpoint, the scan width should desirably be small. Viewing the calculation results of this example, with a scan width of about 1 mm which is about 30 times the peak period, the original intensity non-uniformness is reduced to about 1/200. Namely, an intensity non-uniformness of 50% is reduced to 0.25%, which corresponds to only 1/4 of the original intensity non-uniformness. Further, if the period of the thickness non-uniformness is about 1 mm, there is substantially no amplification function to the intensity non-uniformness. Since the intensity non-uniformness reducing effect is approximately unchanged even if the scan is made through a scan width larger than it, it may be concluded that a sufficient effect is attainable when the X-ray window is scanningly moved with a scan width of about 30 times the peak period.

By performing the scan of the X-ray window through a scan width being equal to d, satisfying the following relation, the non-uniformness of exposure X-ray intensity attributable to the non-uniformness of transmission factor of the beryllium window can be improved considerably.

$$10\sqrt{2\lambda L} < d < 30\sqrt{2\lambda L}$$

where L is the distance from the window to the wafer, and $\lambda$ is the peak wavelength of synchrotron radiation after passing through the X-ray window.

As a specific example, as regards the non-uniformness of thickness of a beryllium film, the resultant non-uniformness of transmission factor can be reduced to 2% or less if a beryllium film formed by deposition is used. Where synchrotron radiation having a peak wavelength of 1 nm, after passing through an X-ray window, is used and the distance from the X-ray extracting window (also serving as a vacuum partition) to the wafer is 500 mm, from the above equation it follows that 316 ($\mu$m)<d<948 ($\mu$m). Thus, by scanningly moving the X-ray window through a width of about 500 microns, the non-uniformness of X-ray intensity upon the wafer position can be reduce to about 2% similar to the transmission factor non-uniformness.

Further, for reduction of the cost of the exposure apparatus, the system may desirably have a common structure regardless of the distance L from the X-ray window to the wafer or the peak wavelength $\lambda$ of the synchrotron radiation after passage through the X-ray window. From this viewpoint of enhancement of the degree of freedom of the apparatus, a scan width that can meet any possible distance L from the X-ray window to the wafer and any possible peak wavelength $\lambda$ of the synchrotron radiation after passage through the X-ray window, is preferable. As regards specific numerical values for them usable in X-ray exposure apparatuses, L may be in a range from 100–800 mm and $\lambda$ may be in a range from 0.5–1 nm. Thus, from the equation above, a scan width of 0.1 mm<d<1.2 mm will be preferable in respect to the reduction of cost of the apparatus.

[Sixth Embodiment]

As compared with the fifth embodiment, a beryllium window film having at least one face thereof finished by polishing was used. A non-uniformness of transmission factor not less than 1% was accomplished. If it is used for an X-ray extracting window of an exposure apparatus, there may occur an intensity non-uniformness of about 8% at the largest. However, by scanningly moving the X-ray window with a width in the above-described range, the total intensity non-uniformness was reduced to 1% or less.

[Seventh Embodiment]

Figure 9:
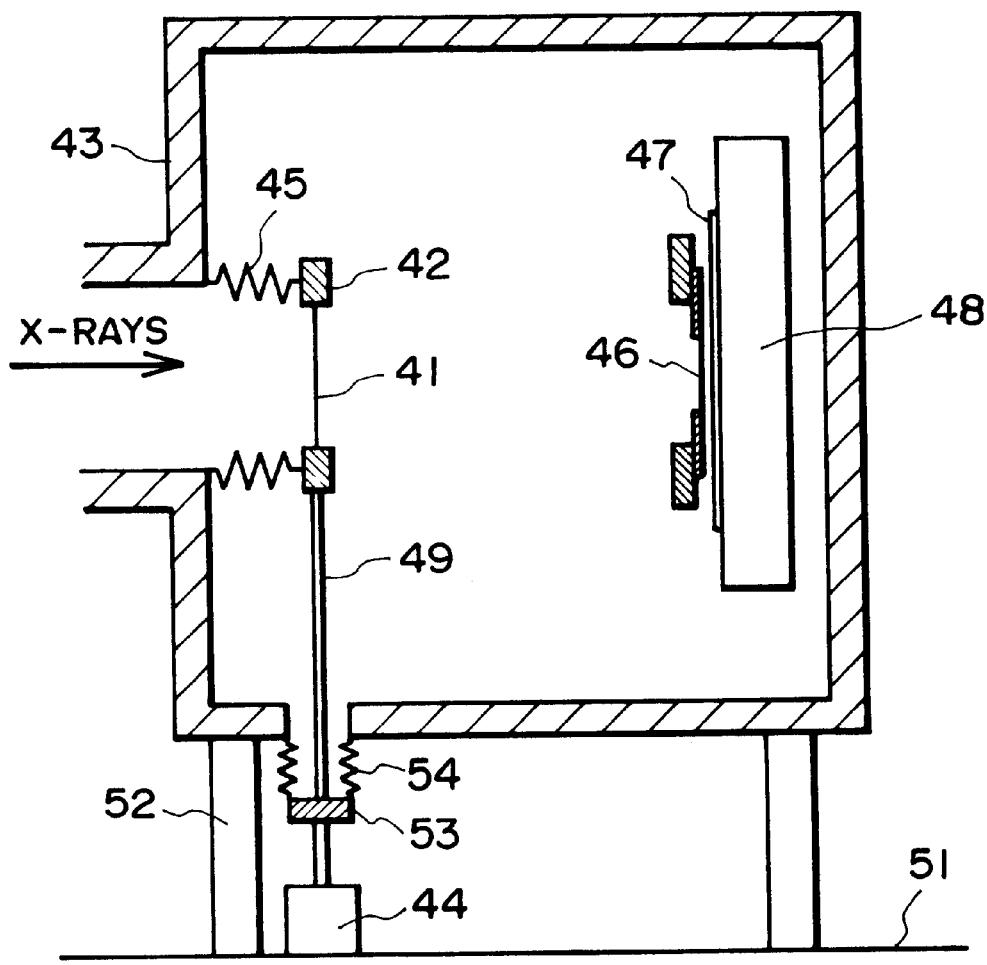
FIG. 9 is a sectional view for explaining an inside structure of a portion of an X-ray exposure apparatus according to a further embodiment of the present invention.

FIG. 9 is a sectional view for explaining an inside structure of a portion of an X-ray exposure apparatus, around an X-ray window, according to a seventh embodiment of the present invention. As illustrated, a major assembly 43 of the exposure apparatus has an opening through which X-rays can pass. At this opening, for gas-tight insulation against an X-ray source side (not shown), a window frame 32 having a beryllium window film 41 attached thereto is mounted by using a bellows 45. The bellows 45 functions to gas-tightly connect the window frame 42 and the edge portion of the opening of the major assembly 43 of the exposure apparatus with each other. Also, it supplies a degree of freedom, allowing minute scan motion of the window frame 42.

The exposure apparatus of the structure described above is fixedly mounted on a floor 51, through legs 52 having an anti-vibration mechanism (not shown). The beryllium window film 41 can be scanningly moved in directions perpendicular to the radiation orbital plane of the synchrotron. In this embodiment, the window frame 42 inside the apparatus is connected to a scan drive system 44 mounted on the floor 51, outside the apparatus, through drive transmitting means 49, by which the X-ray window film 41 can be scanningly and minutely moved in the direction described above. The major assembly 43 of the apparatus is provided with a bore through which the drive transmitting means 49 extends. By using a flange 53 fixed to the drive transmitting means 49 as well as a bellows 54, the bore is gas-tightly sealed.

While the structure is similar to that of the first embodiment, in this embodiment the scanning mechanism is disposed separately from the apparatus major assembly. With this arrangement, the wall of the apparatus major assembly 43 can be free from vibration to be produced by scanning motion of the X-ray window. While the influence of vibration is small in the present invention, this structure provides an X-ray exposure apparatus which is less influenced by vibration.

[Eighth Embodiment]

As regards a thin film to be used in an X-ray window and, particularly, beryllium film, in many cases the thin film production procedure includes a rolling process. Further, although not limited to beryllium, there are cases where a film polishing process is adopted. Where a film is manufactured in accordance with such production procedure, there is in fact a large possibility that the whole film is not at all even in thickness. If those films having no thickness variation are selected and used for production of X-ray windows, the yield is poor and the cost becomes high. Among those films to be abandoned, if there is a film having its thickness distribution changing regularly, particularly, if the thickness is reducing along one direction, such film can be used under the following condition.

First, the direction of film thickness change is registered with the movement direction of beam scan or an exposure amount controlling shutter. By controlling the exposure time, differences in transmission factor due to a change in film thickness are removed or cancelled. This assures uniform exposure amount over the whole exposure surface area. Subsequently, in order to avoid a thickness non-uniformness of small period as described hereinbefore, scanning movement of a window in one direction is performed during the exposure. In this embodiment, the scan direction is limited. That is, it should be done in a direction perpendicular to the direction in which the window material thickness is changing. In other words, the scan should be done in a direction perpendicular to the direction of the beam scan or shutter. By doing so, a large thickness change can be compensated by exposure time control while, on the other hand, a small thickness change can be compensated by scan motion of the window. Thus, this embodiment is effectively applicable to a window material having a thickness changing uniformly.

In accordance with the embodiments of the present invention described hereinbefore, in a single exposure, an X-ray window is scanningly moved without interruption, from just before start of exposure to just after completion of the exposure. With this arrangement, an exposure non-uniformness to be produced by a non-uniformness of transmission factor of the X-ray window is uniformly averaged, such that the exposure non-uniformness can be reduced effectively.

Further, by scanningly moving the X-ray window through a scan width in a predetermined range, the amplification function with which the exposure non-uniformness is made larger than the non-uniformness of transmission factor, in dependence upon the distance between the X-ray window and the article to be exposed, can be weakened. Thus, the exposure non-uniformness can be reduced effectively.

Where a bellows is to be used, the load applied to the bellows is smaller. The lifetime of the bellows is prolonged, and it can be used well in a mass-production machine.

While the invention has been described with reference to the structures disclosed herein, it is not confined to the details set forth and this application is intended to cover such modifications or changes as may come within the purposes of the improvements or the scope of the following claims.

What is claimed is:

1. An X-ray exposure apparatus, comprising:
   a partition structure for defining therein an ambiance of one of an atmospheric pressure and a reduced pressure, for accommodating an X-ray mask and an article to be exposed;
   an X-ray window provided on said partition structure for spatially isolating the inside of said partition structure and an X-ray source, and having a function for transmitting therethrough an X-ray beam with which the article as placed inside said partition structure can be exposed through an X-ray mask; and
   a scanning mechanism for scanningly moving said X-ray window in a single exposure and without interruption at least in a first direction perpendicular to the radiation orbital plane of a synchrotron and at least from just before the start of the exposure to just after the end of the exposure, wherein the X-ray source comprises said synchrotron for providing a radiation X-ray beam, and wherein said apparatus further comprises an X-ray reflection mirror for expanding the radiation X-ray beam in a direction perpendicular to a radiation orbital plane of the synchrotron, to perform simultaneous exposure of a required exposure region on the article.

2. An apparatus according to claim 1, further comprising a shutter mechanism for controlling an exposure time on the basis of opening/closing motion of a shutter thereof.

3. An apparatus according to claim 2, further comprising control means for controlling said scanning mechanism and said shutter mechanism, such that said shutter is opened after start of the scan of said X-ray window and that the scan of said X-ray window is completed after said shutter is closed.

4. An apparatus according to claim 1, wherein the X-ray source comprises a synchrotron for providing a radiation X-ray beam, and wherein said apparatus further comprises a movable mirror for scanningly deflecting the radiation X-ray beam in a direction perpendicular to a radiation orbital plane of the synchrotron, so that a required exposure region on the article to be exposed can be exposed by beam scan of the X-ray beam.

5. An apparatus according to claim 4, further comprising control means for controlling said scanning mechanism and said movable mirror, such that the beam scan starts after start of the scan scan of said X-ray window and that the scan of said X-ray window is completed after completion of the beam scan.

6. An apparatus according to claim 1, further comprising speed changing means for changing a scan speed of said X-ray window in accordance with an exposure time of the article to be exposed.

7. An apparatus according to claim 1, wherein said scanning mechanism scanningly moves said X-ray window in an opposite direction to said first direction in a second exposure to be done after a first exposure.

8. An apparatus according to claim 1, wherein said X-ray window has a region with a length, at least in the scan direction, which is longer than the region to be exposed, plus a length to be scanned during an exposure in the scan direction.

9. An apparatus according to claim 1, wherein said X-ray window is made of a beryllium material.

10. An apparatus according to claim 1, wherein a scan width d of said X-ray window is in a range satisfying 0.1 mm<d<1.2 mm.

11. An apparatus according to claim 1, wherein a scan width d of said X-ray window is in a range satisfying $10\sqrt{(2\lambda L)} < d < \sqrt{(2\lambda L)}$, where L is a distance from said X-ray window to the article to be exposed, and $\lambda$ is a peak wavelength of X-ray spectrum after passage through said X-ray window.

12. An apparatus according to claim 11, wherein the distance L is not greater than 0.8 mm and the wavelength is not greater than 1 nm.

13. An apparatus according to claim 1, wherein at least one face of said X-ray window has been finished by polishing.

14. An apparatus according to claim 1, wherein the scan direction of said scanning mechanism lies in one direction.

15. An apparatus according to claim 1, wherein said X-ray window has a thickness distribution which changes uniformly in one direction, and wherein said scanning mechanism performs the scan along the one direction in which the thickness distribution changes.

16. An X-ray exposure method for exposing an article with an X-ray beam and through an X-ray mask, the article to be exposed and the X-ray mask being accommodated in an ambiance of one of an atmospheric pressure and a reduced pressure, defined inside a partition structure, said method comprising the steps of:
   scanningly moving an X-ray window provided on the partition structure, for spatially isolating the inside of the partition structure and an X-ray source, wherein the X-ray source comprises a synchrotron for providing a radiation X-ray beam, and wherein said apparatus further comprises an X-ray reflection mirror for expanding the radiation X-ray beam in a direction perpendicular to a radiation orbital plane of the synchrotron, to perform simultaneous exposure of a required exposure region on the article and having a function for transmitting therethrough an X-ray beam with which the article placed inside the partition structure can be exposed through the X-ray mask, the X-ray window being scanningly moved in a single exposure without interruption, at least from just before start of the exposure to just after the end of the exposure, and projecting an X-ray beam to the article to be exposed, through the X-ray window, being scanned, and the X-ray mask.

17. A method according to claim 16, further comprising controlling the scan and a shutter so that the shutter is opened after start of the scan of the X-ray window and that the scan of the X-ray window is completed after the shutter is closed.

18. A method according to claim 16, further comprising controlling the scan so that beam scan with the X-ray beam starts after start of the scan of the X-ray window and that the scan of the X-ray window is completed after completion of the beam scan.

19. A method according to claim 16, wherein the X-ray window has a thickness distribution which changes uniformly in one direction, and wherein the scanning mechanism performs the scan along the one direction in which the thickness distribution changes.

* * * * *

UNITED STATES PATENT AND TRADEMARK OFFICE
CERTIFICATE OF CORRECTION

PATENT NO. : 6,351,512 B1  Page 1 of 1
DATED : February 26, 2002
INVENTOR(S) : Shigeru Terashima et al.

It is certified that error appears in the above-identified patent and that said Letters Patent is hereby corrected as shown below:

<u>Drawings,</u>
Sheet 9, FIG. 7, "AX" should read -- OF --; and
Sheet 10, FIG. 8 "MULTPLE" should read -- MULTIPLE --.

<u>Column 5,</u>
Line 23, "⟨f⟨x⟩⟩" shoud read -- ⟨f(x)⟩ --; and
Line 46, "become" should read -- becomes --.

<u>Column 6,</u>
Line 4, "⟨f⟨x⟩⟩" shoud read -- ⟨f(x)⟩ --; and
Line 20, "with in" should read -- with --.

<u>Column 9,</u>
Line 35, "is" should read -- are --.

<u>Column 10,</u>
Line 42, "because of that the" should read -- because the --.

<u>Column 12,</u>
Line 9, "what described" should read -- what is described --.

<u>Column 13,</u>
Line 38, "reduce" should read -- reduced --.

<u>Column 16,</u>
Line 14, "scan scan" should read -- scan --.

Signed and Sealed this

Eighteenth Day of June, 2002

*Attest:*

*Attesting Officer*

JAMES E. ROGAN
*Director of the United States Patent and Trademark Office*